United States Patent
Niwa

(10) Patent No.: US 8,232,847 B2
(45) Date of Patent: Jul. 31, 2012

(54) OSCILLATION CIRCUIT

(75) Inventor: Isao Niwa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 45 days.

(21) Appl. No.: 12/865,525

(22) PCT Filed: Jan. 18, 2010

(86) PCT No.: PCT/JP2010/050488
§ 371 (c)(1),
(2), (4) Date: Jul. 30, 2010

(87) PCT Pub. No.: WO2010/084838
PCT Pub. Date: Jul. 29, 2010

(65) Prior Publication Data
US 2011/0001570 A1    Jan. 6, 2011

(30) Foreign Application Priority Data
Jan. 23, 2009    (JP) .................................. 2009-013388

(51) Int. Cl.
*H03B 5/32*    (2006.01)

(52) U.S. Cl. ............... 331/158; 331/116 R; 331/116 FE

(58) Field of Classification Search .................. 331/158, 331/116 R, 116 FE
See application file for complete search history.

(56) References Cited

U.S. PATENT DOCUMENTS
6,133,801 A    10/2000    Tanaka

FOREIGN PATENT DOCUMENTS
| JP | 59-091709 | 5/1984 |
| JP | 62-109406 | 5/1987 |
| JP | 09-289416 | 4/1997 |
| JP | 2001-16099 | 1/2001 |
| JP | 2005-79648 | 3/2005 |

*Primary Examiner* — Arnold Kinkead
(74) *Attorney, Agent, or Firm* — Fish & Richardson P.C.

(57) ABSTRACT

An oscillation circuit includes a piezoelectric oscillator, a resistive element, and an exciting circuit connected between an input node and an output node in parallel with one another, a first capacitor connected between the input node and a ground node, and a second capacitor connected between the output node and the ground node. The exciting circuit includes a NAND circuit and first and second inverters that are cascade-connected. Oscillation of the piezoelectric oscillator is started when an enable signal input to the NAND circuit is switched to an H level.

6 Claims, 12 Drawing Sheets

FIG.6
(A)
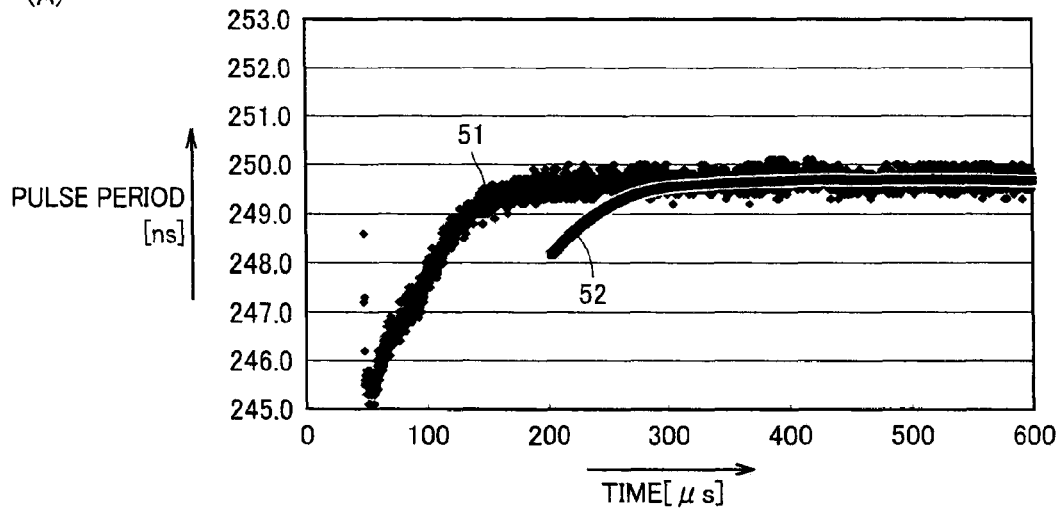
(B)
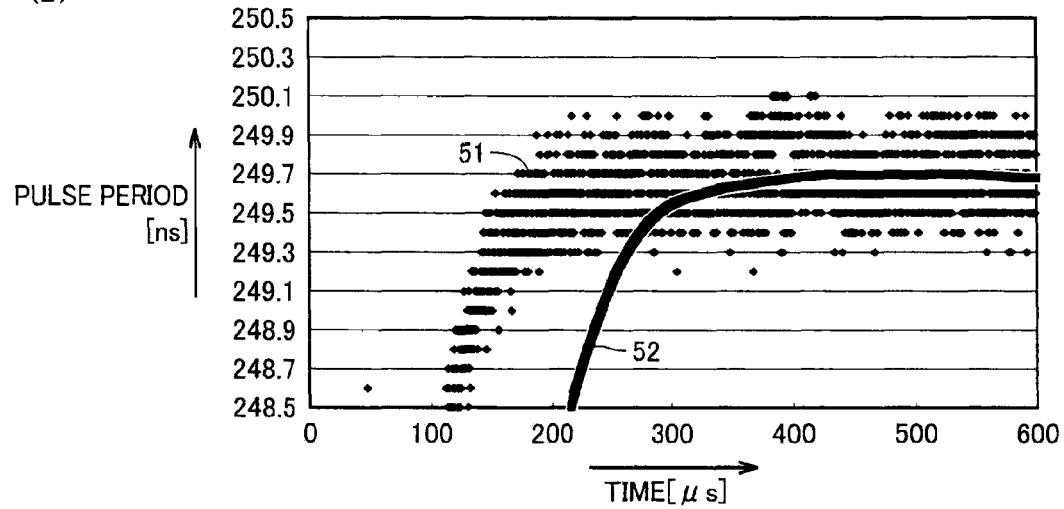

OSCILLATION CIRCUIT

TECHNICAL FIELD

The present invention relates to an oscillation circuit using a piezoelectric oscillator such as a crystal oscillator or a ceramic oscillator.

BACKGROUND ART

A conventional crystal oscillation circuit obtains oscillation output by coupling a crystal oscillator, a feedback resistive element, and a capacitive element between an input terminal and an output terminal of an inverter including a P-channel MOS (Metal-Oxide Semiconductor) transistor and an N-channel MOS transistor. The crystal oscillation circuit has a problem that it takes time until the oscillation frequency and the amplitude level are stabilized.

Regarding this problem, for example, a crystal oscillation circuit described in Japanese Patent Laying-Open No. 59-91709 (Patent Document 1) is known. This oscillation circuit has two sets of crystal oscillation circuits sharing one crystal oscillator, and is configured such that the crystal oscillator vibrated by one crystal oscillation circuit is switchingly connected to the other crystal oscillation circuit and operated.

PRIOR ART DOCUMENTS

Patent Documents
Patent Document 1: Japanese Patent Laying-Open No. 59-91709

SUMMARY OF THE INVENTION

Problems to be Solved by the Invention

In battery-powered electronic devices including portable phones, saving electric power is desired to allow a battery to be used for longer time. For this reason, it is desirable to intermittently operate a clock signal to be supplied to an electronic component. For such an intermittent operation, it is necessary to reduce time taken from when a piezoelectric oscillator (such as a crystal oscillator, a ceramic oscillator) is in a stopped state to when oscillation is stabilized. The technique described in Japanese Patent Laying-Open No. 59-91709 (Patent Document 1) described above does not disclose reduction of start-up time taken from when a piezoelectric oscillator is in a stopped state to when oscillation is stabilized.

One object of the present invention is to provide an oscillation circuit capable of reducing start-up time taken from when a piezoelectric oscillator is in a stopped state to when oscillation is stabilized.

Means for Solving the Problems

In summary, the present invention is an oscillation circuit including a piezoelectric oscillator, a resistive element, first and second capacitive elements, and a first exciting circuit. The piezoelectric oscillator is provided between first and second nodes. The resistive element is provided between the first and second nodes in parallel with the piezoelectric oscillator. The first capacitive element is provided between the first node and a ground node. The second capacitive element is provided between the second node and the ground node. The first exciting circuit is provided between the first and second nodes in parallel with each of the piezoelectric oscillator and the resistive element, for inverting and amplifying a signal from the first node and outputting the signal to the second node. The first exciting circuit includes a plurality of cascade-connected logic elements each used as an amplifier circuit.

In a preferred embodiment, the oscillation circuit further includes a timer circuit and a second exciting circuit. The timer circuit outputs a control signal that is in an active state for a predetermined time from when an enable signal attains an active state. The second exciting circuit is provided between the first and second nodes in parallel with each of the piezoelectric oscillator, the resistive element, and the first exciting circuit, for inverting and amplifying a signal from the first node and outputting the signal to the second node. Here, the second exciting circuit has a power amplification ratio lower than a power amplification ratio of the first exciting circuit. The second exciting circuit includes a logic element outputting a signal at a constant logic level when the enable signal is in an inactive state, and operating as an amplifier circuit when the enable signal is in an active state. Further, logic elements in first and last stages among the plurality of logic elements constituting the first exciting circuit are three-state buffers that are in a high impedance state when the control signal is in an inactive state.

In another preferred embodiment, the oscillation circuit further includes a timer circuit, first and second switches, and a second exciting circuit. The timer circuit outputs a control signal that is in an active state for a predetermined time from when an enable signal attains an active state. The first switch is provided between the first node and an input end of the first exciting circuit to be in an ON state when the control signal is in an active state and to be in an OFF state when the control signal is in an inactive state. The second switch is provided between the second node and an output end of the first exciting circuit to be in an ON state when the control signal is in an active state and to be in an OFF state when the control signal is in an inactive state. The second exciting circuit is provided between the first and second nodes in parallel with each of the piezoelectric oscillator, the resistive element, and the first exciting circuit, for inverting and amplifying a signal from the first node and outputting the signal to the second node. Here, the second exciting circuit has a power amplification ratio lower than a power amplification ratio of the first exciting circuit. The second exciting circuit includes a logic element outputting a signal at a constant logic level when the enable signal is in an inactive state, and operating as an amplifier circuit when the enable signal is in an active state.

In still another preferred embodiment, the oscillation circuit further includes a second exciting circuit, a timer circuit, and first and second switches. The second exciting circuit is provided between the first and second nodes in parallel with each of the piezoelectric oscillator, the resistive element, and the first exciting circuit, for inverting and amplifying a signal from the first node and outputting the signal to the second node. Here, the second exciting circuit has a power amplification ratio lower than a power amplification ratio of the first exciting circuit. The timer circuit outputs a control signal that is in an active state for a predetermined time from when an enable signal attains an active state. The first switch connects an input end of the first exciting circuit with the first node when the control signal is in an active state, and connects an input end of the second exciting circuit with the first node when the enable signal is in an active state and the control signal is in an inactive state. The second switch connects an output end of the first exciting circuit with the second node when the control signal is in an active state, and connects an output end of the second exciting circuit with the second node when the enable signal is in an active state and the control signal is in an inactive state.

Preferably, in the present invention, at least one of the plurality of logic elements constituting the first exciting circuit outputs a signal at a constant logic level when an enable signal is in an inactive state.

Effects of the Invention

According to the present invention, since the first exciting circuit is configured with a plurality of cascade-connected logic elements, the first exciting circuit has a high power amplification ratio, when compared with the case where it is configured with a single logic element. As a result, start-up time taken from when a piezoelectric oscillator is in a stopped state to when oscillation is stabilized can be reduced.

Preferably, if the oscillation circuit is configured to use the first exciting circuit for accelerating excitation when oscillation is started, and to operate only the second exciting circuit having a power amplification ratio lower than that of the first exciting circuit when oscillation is stabilized, power consumption in the entire oscillation circuit can be reduced.

BRIEF DESCRIPTION OF THE DRAWINGS

FIG. 6 is a view showing a result of measurement of output of oscillation circuit 101 of FIG. 4.

MODES FOR CARRYING OUT THE INVENTION

Figure 1:
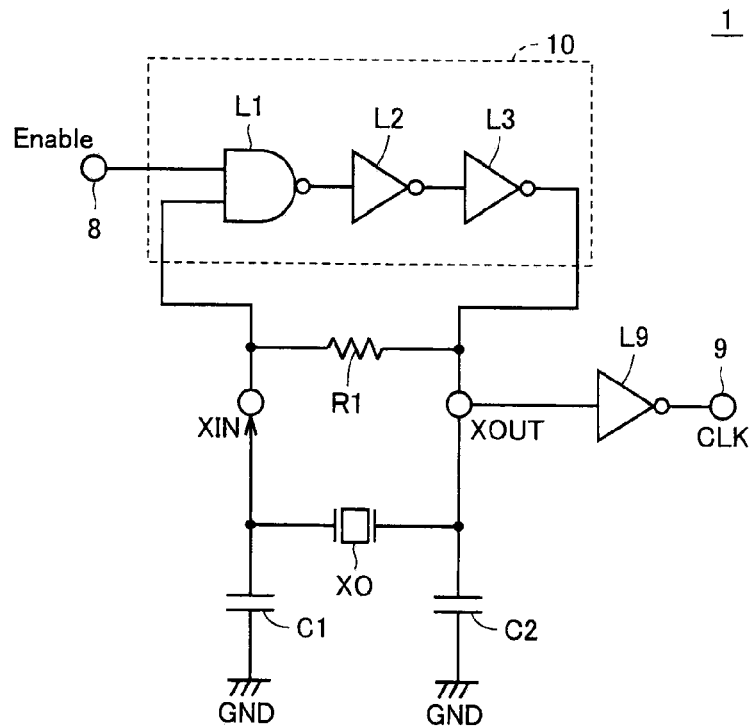
FIG. 1 is a circuit diagram showing a configuration of an oscillation circuit 1 in accordance with Embodiment 1 of the present invention.

Hereinafter, embodiments of the present invention will be described in detail with reference to the drawings. In the description below, identical or corresponding parts will be designated by the same reference numerals, and the description thereof will not be repeated.

[Embodiment 1]

FIG. 1 is a circuit diagram showing a configuration of an oscillation circuit 1 in accordance with Embodiment 1 of the present invention. Referring to FIG. 1, oscillation circuit 1 includes a piezoelectric oscillator XO, a resistive element R1, and an exciting circuit 10 connected between an input node XIN and an output node XOUT in parallel with one another, a capacitor (capacitative element) C1 connected between node XIN and a ground node GND, and a capacitor (capacitative element) C2 connected between node XOUT and ground node GND.

Oscillation circuit 1 is a Colpitts oscillation circuit configured utilizing the characteristic that piezoelectric oscillator XO exhibits inductive reactance in the vicinity of the natural frequency of piezoelectric oscillator XO. In this case, it can be considered that piezoelectric oscillator XO serves as a filter outputting only a sine wave having a resonant frequency, among signals input from node XOUT. As piezoelectric oscillator XO utilizing the piezoelectric effect, for example, a crystal oscillator, a ceramic oscillator, or the like can be used.

Exciting circuit 10 inverts and amplifies a signal from node XIN, and outputs the signal to node XOUT. Exciting circuit 10 includes a NAND circuit L1 and inverters L2, L3 that are cascade-connected between nodes XIN and XOUT. In the case of Embodiment 1, NAND circuit L1 and inverters L2, L3 are configured with Complementary Metal-Oxide Semiconductor (CMOS) logic elements. These logic elements, which are originally used as digital Integrated Circuits (ICs), are used as amplifier circuits. Resistive element R1 is provided to supply a bias that is half a power supply voltage to input node XIN of exciting circuit 10.

Oscillation circuit 1 of FIG. 1 further includes an inverter L9 for shaping and outputting the signal from output node XOUT. Inverter L9 is connected between node XOUT and a clock terminal 9 for outputting a clock signal CLK.

Figure 2:
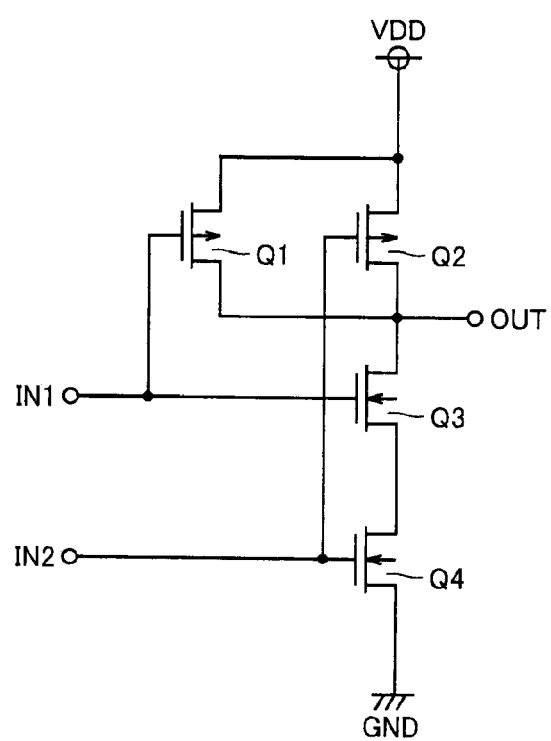
FIG. 2 is a circuit diagram showing a configuration of a NAND circuit L1 in FIG. 1.

FIG. 2 is a circuit diagram showing a configuration of NAND circuit L1 in FIG. 1. Referring to FIG. 2, the NAND circuit includes P-channel MOS transistors Q1, Q2 and N-channel MOS transistors Q3, Q4. MOS transistors Q1, Q2 are connected in parallel between a power supply node VDD and an output terminal OUT, and MOS transistors Q3, Q4 are connected in series between output terminal OUT and ground node GND. Gates of MOS transistors Q1, Q3 are connected to a first input terminal IN1, and gates of MOS transistors Q2, Q4 are connected to a second input terminal IN2.

In the case of oscillation circuit 1 of FIG. 1, the first input terminal of NAND circuit L1 (IN1 in FIG. 2) is connected with an enable terminal 8 to which an enable signal Enable is input, and the second input terminal of the NAND circuit (IN2 in FIG. 2) is connected with node XIN. When the enable signal is at an L level (in an inactive state), MOS transistor Q1 in FIG. 2 attains an ON state, and MOS transistor Q3 attains an OFF state, and thus output of NAND circuit L1 is fixed to an H level (power supply voltage). On the other hand, when the enable signal is at an H level (in an active state), MOS transistor Q1 in FIG. 2 attains an OFF state, and MOS transistor Q3 attains an ON state, and thus NAND circuit L1 becomes equivalent to an inverter of FIG. 3 described below.

Figure 3:
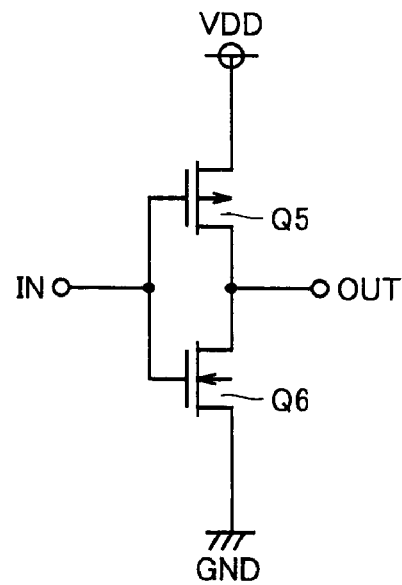
FIG. 3 is a circuit diagram showing a configuration of inverters L2, L3, and L9 in FIG. 1.

FIG. 3 is a circuit diagram showing a configuration of inverters L2, L3, and L9 in FIG. 1. Referring to FIG. 3, an inverter includes a P-channel MOS transistor Q5 and an N-channel MOS transistor Q6. MOS transistor Q5 is connected between power supply node VDD and an output terminal OUT, and MOS transistor Q6 is connected between output terminal OUT and ground node GND. Gates of MOS transistors Q5, Q6 are connected to an input terminal IN.

Referring to FIG. 1 again, when enable signal Enable is at an L level (in an inactive state), the output of NAND circuit L1 is fixed to an H level, and thus piezoelectric oscillator XO is in a stopped state. When the enable signal is switched from an L level (inactive state) to an H level (active state), NAND circuit L1 is equivalent to an inverter. Therefore, piezoelectric oscillator XO starts oscillation by being excited by cascade-connected inverters in a total of three stages on an inverter basis.

Next, the effect of oscillation circuit 1 of FIG. 1 will be described in comparison with a comparative example.

Figure 4:
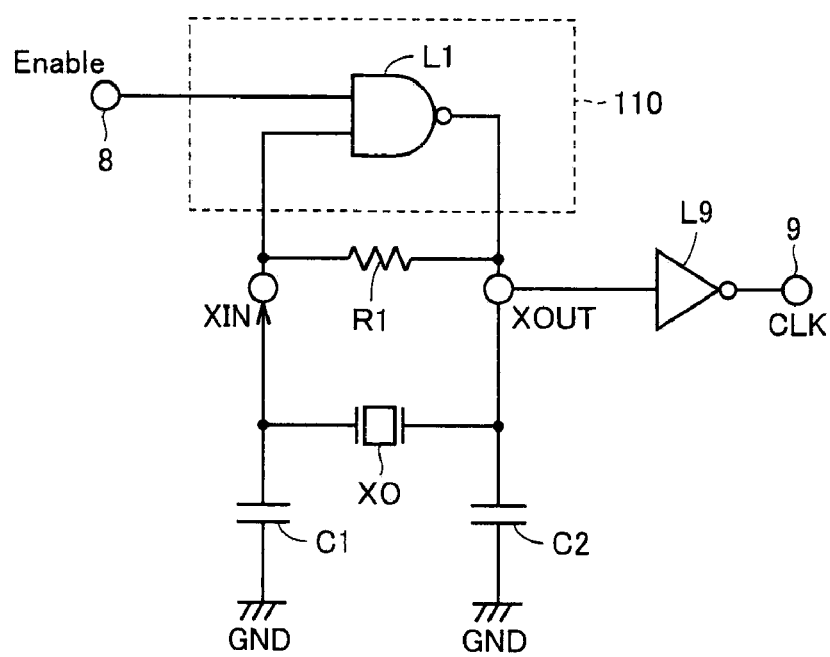
FIG. 4 is a circuit diagram showing a configuration of an oscillation circuit 101 as a comparative example of oscillation circuit 1 of FIG. 1.

FIG. 4 is a circuit diagram showing a configuration of an oscillation circuit 101 as a comparative example of oscillation circuit 1 of FIG. 1. Referring to FIG. 4, an exciting circuit 110 of oscillation circuit 101 is different from exciting circuit 10 of oscillation circuit 1 of FIG. 1 in that it includes only CMOS NAND circuit L1 in one stage. As for the rest, oscillation circuit 101 of FIG. 4 is identical to oscillation circuit 1 of FIG. 1. Accordingly, identical or corresponding parts will be designated by the same reference numerals, and the description thereof will not be repeated.

Figure 5:
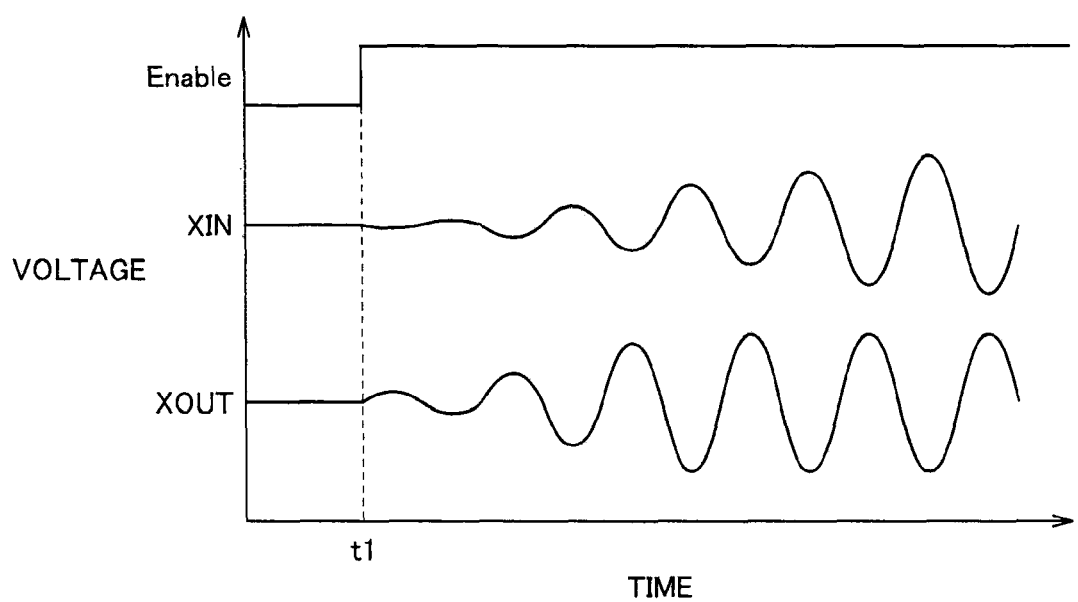
FIG. 5 is a view schematically showing voltage waveforms at nodes MN, XOUT when oscillation circuit 101 is started up.

FIG. 5 is a view schematically showing voltage waveforms at nodes XIN, XOUT when oscillation circuit 101 is started up. FIG. 5 shows, in order from the top, a waveform of enable signal Enable, a voltage waveform at node XIN, and a voltage waveform at node XOUT. The axis of abscissas in FIG. 5 represents time.

Referring to FIGS. 4 and 5, when enable signal Enable attains an H level (active state) at a time point t1, piezoelectric oscillator XO starts oscillation. The amplitude of the sine wave at input node XIN immediately after the start of oscillation is smaller than that when oscillation is stabilized. On this occasion, the amplitude of the voltage at output node XOUT after being amplified by exciting circuit 110 is also small, and its waveform is a sine wave. Thereafter, the amplitudes of the voltages at nodes XIN, XOUT gradually increase and reach a steady state. On this occasion, if the power amplification ratio of exciting circuit 110 is not high enough, the magnitude of an alternating current I in an exciting level $Re \times I^2$ (where Re is an effective resistance of a crystal oscillator, and I is an alternating current flowing to the crystal oscillator) of piezoelectric oscillator XO is small. As a result, it takes time until the amplitudes of the voltages reach a steady state.

Consequently, if exciting circuit 10 is configured with cascade-connected logic elements L1 to L3 in three stages on an inverter basis as shown in FIG. 1, the power amplification ratio can be increased, when compared with exciting circuit 110 of FIG. 4 configured with NAND circuit L1 in one stage on an inverter basis. As a result, the magnitude of alternating current I in the exciting level $Re \times I^2$ of piezoelectric oscillator XO is also increased when compared with the case in FIG. 4, and thus time taken until oscillation of piezoelectric oscillator XO is stabilized (namely, start-up time) can be reduced.

The effect of reducing the start-up time described above will be further described based on results of an experiment. In the experiment, a ceramic oscillator was used as piezoelectric oscillator XO in FIGS. 1 and 4, and the resistance value of resistive element R1 was set to 1 MΩ. Then, clock signal CLK was monitored using a time interval analyzer (YOKOGAWA TA320) to measure time taken until a pulse period of clock signal CLK was stabilized. It is to be noted that, instead of the inverters in FIG. 1, NAND circuits having one input terminal fixed to an H level were used in the experiment.

Firstly, an experimental result of oscillation circuit 101 of FIG. 4 as a comparative example will be described.

FIG. 6 is a view showing a result of measurement of output of oscillation circuit 101 of FIG. 4. FIG. 6(B) is an enlarged view of FIG. 6(A). In FIG. 6(A) and FIG. 6(B), the axis of abscissas represents time elapsed after enable signal Enable attains an H level (active state), and the axis of ordinate represents the pulse period of the clock signal. FIG. 6 shows a measurement value 51 of the pulse period measured at each time point, and a moving average value 52 obtained by performing moving average on measurement values 51 for each section of 155.5 microseconds.

Here, the start-up time taken until oscillation of piezoelectric oscillator XO is stabilized will be defined as described below, based on data of moving average value 52. Firstly, the maximum value and the minimum value of moving average value 52 after 1 millisecond are determined, and reach time taken until moving average value 52 reaches any of the maximum value and the minimum value is determined. Then, time obtained by subtracting 155.5 microseconds, which represents a section of moving average, from the reach time is defined as the start-up time. In the case of FIG. 6, since the reach time is 385.7 microseconds, the start-up time is evaluated as 230.2 microseconds.

Next, an experimental result of oscillation circuit 1 of FIG. 1 in accordance with Embodiment 1 will be described.

Figure 7:
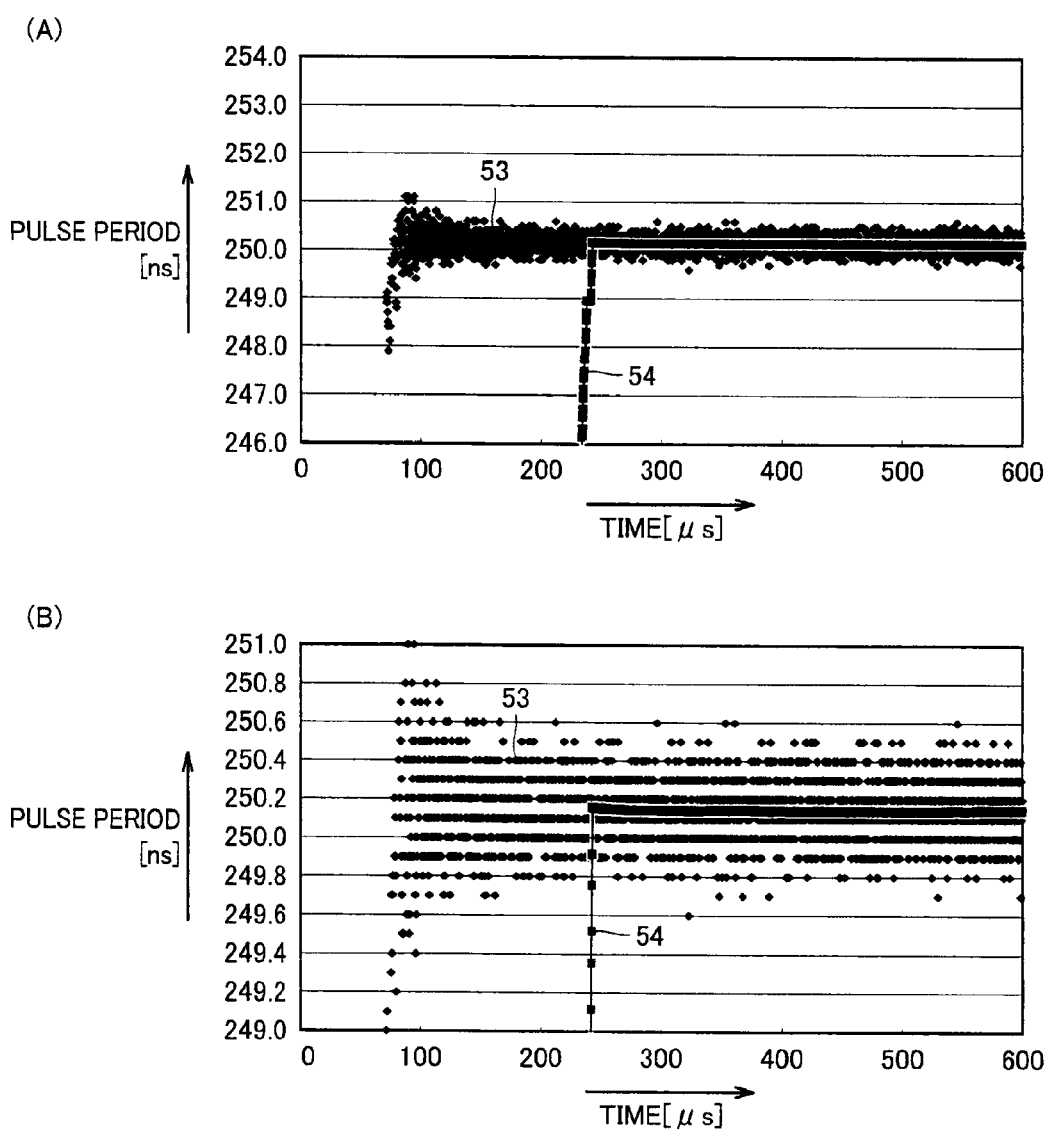
FIG. 7 is a view showing a result of measurement of output of oscillation circuit 1 of FIG. 1.

FIG. 7 is a view showing a result of measurement of output of oscillation circuit 1 of FIG. 1. FIG. 7(B) is an enlarged view of FIG. 7(A). In FIG. 7(A) and FIG. 7(B), the axis of abscissas represents time elapsed after enable signal Enable attains an H level (active state), and the axis of ordinate represents the pulse period of the clock signal. FIG. 7 shows a measurement value 53 of the pulse period measured at each time point, and a moving average value 54 obtained by performing moving average on measurement values 53 for each section of 155.5 microseconds.

When the start-up time is evaluated as in the case of FIG. 6, the reach time in the case of FIG. 7 is determined as 243.1 microseconds, and thus the start-up time can be evaluated as 87.6 microseconds, Namely, it was proved that the start-up time can be reduced by about one third by increasing the number of stages of logic elements from one to three on a CMOS inverter basis.

Figure 8:
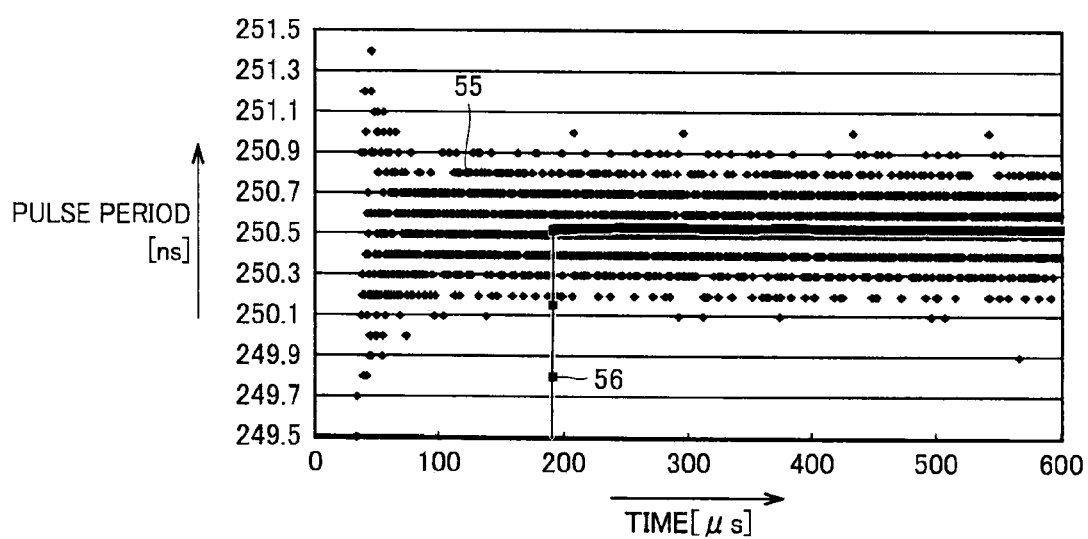
FIG. 8 is a view showing a result of measurement of output of an oscillation circuit in the case where an exciting circuit 10 in FIG. 1 is configured with logic elements in five stages.

FIG. 8 is a view showing a result of measurement of output of an oscillation circuit in the case where exciting circuit 10 in FIG. 1 is configured with logic elements in five stages. Specifically, the exciting circuit is configured with NAND circuits in five stages. Enable signal Enable is input to one input terminal of the NAND circuit in the first stage, and one input terminal of each of the remaining NAND circuits is fixed to an H level. Therefore, the exciting circuit in the case of FIG. 8 is configured with logic elements in five stages on a CMOS inverter basis.

Also in FIG. 8, as in the cases of FIGS. 6 and 7, the axis of abscissas represents time elapsed after enable signal Enable attains an H level (active state), and the axis of ordinate represents the pulse period of the clock signal. FIG. 8 shows a measurement value 55 of the pulse period measured at each time point, and a moving average value 56 obtained by performing moving average on measurement values 55 for each section of 155.5 microseconds.

When the start-up time is evaluated as in the case of FIG. 6, the reach time in the case of FIG. 8 is determined as 192.7 microseconds, and thus the start-up time can be evaluated as 37.2 microseconds. Namely, it can be seen that the start-up time can be reduced by about one sixth by increasing the number of stages of logic elements from one to five on a CMOS inverter basis.

As described above, according to oscillation circuit 1 of Embodiment 1, the magnitude of alternating current I in the exciting level Re×I² of piezoelectric oscillator XO immediately after the start of oscillation can be increased by inverting and amplifying output of piezoelectric oscillator XO using CMOS logic elements configured in multiple stages. As a result, the start-up time taken until oscillation of piezoelectric oscillator XO is stabilized can be reduced.

It is to be noted that each of inverters L2, L3 in FIG. 1 can be replaced by a NAND circuit having one input fixed to an H level, a NOR circuit having one input fixed to an L level, an XOR (exclusive OR) circuit having one input fixed to an H level, or the like.

Further, NAND circuit L1 in FIG. 1 can be replaced by a NOR circuit. In the case of a NOR circuit, enable signal Enable is in an active state when it is at an L level.

Further, it is not necessary to dispose NAND circuit L1, to which enable signal Enable is input, in the first stage of cascade-connected CMOS logic elements as shown in FIG. 1. It is only necessary to dispose NAND circuit L1 for receiving enable signal Enable as at least one of logic elements constituting exciting circuit 10.

When Embodiment 1 is further generalized, each of a plurality of cascade-connected logic elements constituting exciting circuit 10 may be any logic element such as an inverter, a NAND circuit, a NOR circuit, an AND circuit, an OR circuit, an XOR circuit, a buffer, or a three-state buffer. However, it is necessary to combine the logic elements so as to invert the logic level of an input signal as entire exciting circuit 10. If a two-input logic element such as a NAND circuit, a NOR circuit, an AND circuit, an OR circuit, or an XOR circuit is used instead of an inverter or a buffer (a through circuit) in this case, one of the inputs is fixed to an H level or an L level.

Furthermore, although CMOS logic elements have been described as an example in Embodiment 1 described above, the logic elements are not necessarily limited to those of CMOS type. For example, the logic elements may be configured using P-channel MOS transistors only, or using N-channel MOS transistors only, instead of using CMOS logic elements.

[Embodiment 2]

Figure 9:
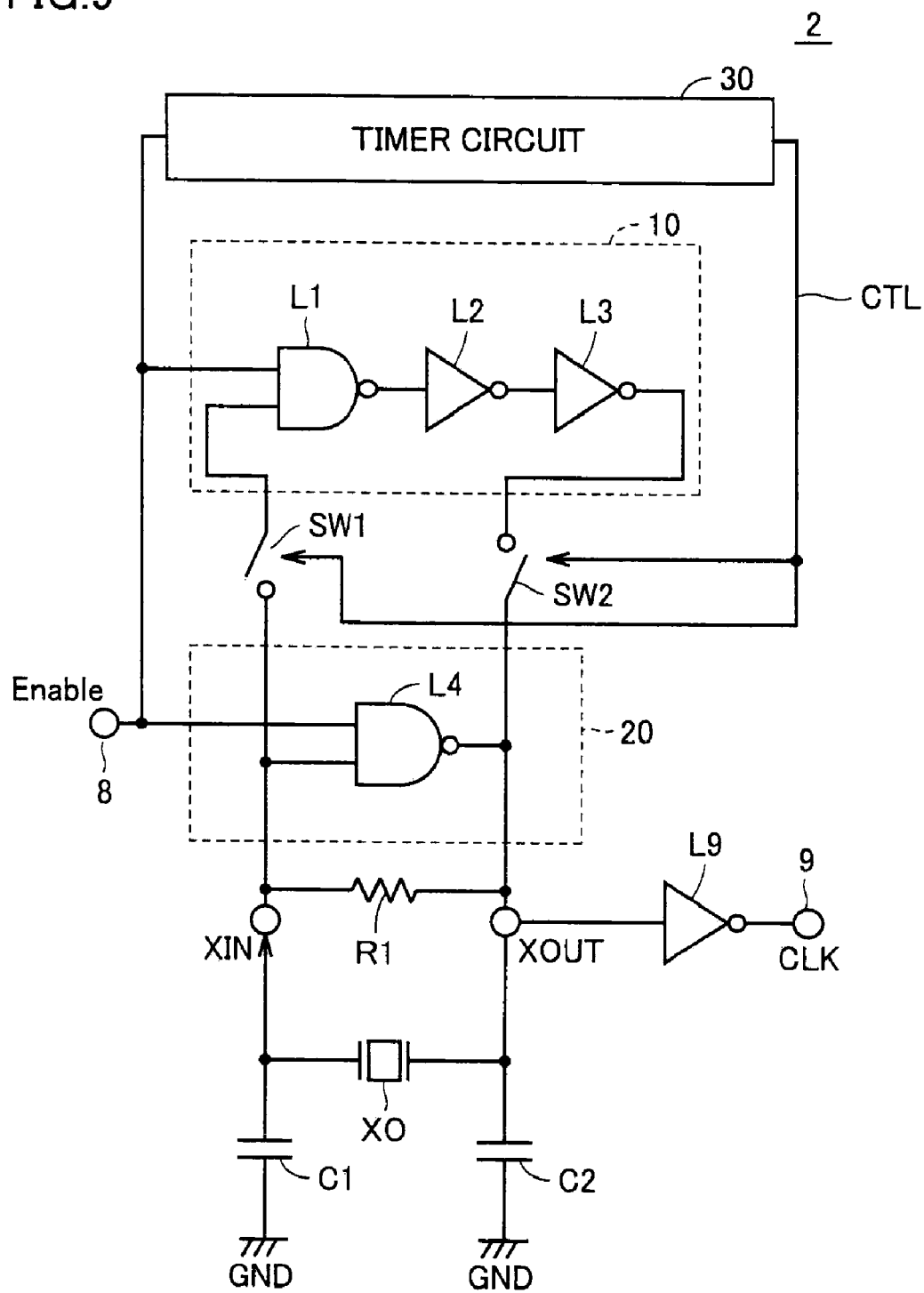
FIG. 9 is a circuit diagram showing a configuration of an oscillation circuit 2 in accordance with Embodiment 2 of the present invention.

FIG. 9 is a circuit diagram showing a configuration of an oscillation circuit 2 in accordance with Embodiment 2 of the present invention. Oscillation circuit 2 of FIG. 9 is different from oscillation circuit 1 of FIG. 1 in that it further includes a second exciting circuit 20 provided between nodes XIN and XOUT in parallel with first exciting circuit 10.

The second exciting circuit 20 inverts and amplifies a signal from node XIN, and outputs the signal to node XOUT. Although the second exciting circuit 20 is identical to the first exciting circuit 10 in this regard, it is different from the first exciting circuit 10 in that it is configured with cascade-connected logic elements in stages smaller in number than the number of stages in the first exciting circuit 10 on a CMOS inverter basis. As a result, the power amplification ratio of the second exciting circuit 20 is lower than that of the first exciting circuit 10, and the magnitude of alternating current I in the exciting level Re×I² of piezoelectric oscillator XO is also small.

Specifically, in the case of FIG. 9, the second exciting circuit 20 includes a two-input NAND circuit L4 connected between nodes XIN and XOUT. Enable signal Enable is input to one input terminal of NAND circuit L4, and the other input terminal of NAND circuit L4 is connected with input node MN. While enable signal Enable is at an L level (in an inactive state), output of NAND circuit L4 is fixed to an H level, and when enable signal Enable attains an H level (active state), NAND circuit L4 operates as an inverter for exciting piezoelectric oscillator XO.

Oscillation circuit 2 of FIG. 9 further includes a timer circuit 30, a switch SW1 provided between node XIN and an input end of the first exciting circuit 10 (one input terminal of NAND circuit L1), and a switch SW2 provided between node XOUT and an output end of the first exciting circuit 10 (an output terminal of inverter L3).

Timer circuit 30 outputs a control signal CTL that is in an active state for a predetermined time from when enable signal Enable attains an H level (active state). The timer circuit can be configured using a delay circuit such as a CR integration circuit to delay the timing of enable signal Enable. The timer circuit can also be configured using a counter circuit utilizing another clock signal.

Switches SW1, SW2 receive control signal CTL, and become conductive when control signal CTL is in an active state, and become nonconductive when control signal CTL is in an inactive state. By switches SW1, SW2 becoming conductive, piezoelectric oscillator XO is excited by both the first exciting circuit 10 and the second exciting circuit 20 connected in parallel. Further, when switches SW1, SW2 become nonconductive, piezoelectric oscillator XO is excited by the second exciting circuit 20 only.

Therefore, according to oscillation circuit 2 of Embodiment 2, at the time when oscillation is started, in which control signal CTL is in an active state, the start-up time can be reduced by using the first exciting circuit 10 and the second exciting circuit 20 connected in parallel. At the time after oscillation is stabilized, in which control signal CTL returns to an inactive state, power consumption in entire oscillation circuit 2 can be reduced by using only the second exciting circuit 20 having a power amplification ratio lower than that of the first exciting circuit 10.

[Embodiment 3]

In an oscillation circuit 3 of Embodiment 3, three-state buffers are used instead of switches SW1, SW2 in oscillation circuit 2 of Embodiment 2. The three-state buffers serve as switches SW1, SW2, and also serve as logic elements of the first exciting circuit used for accelerating excitation of piezoelectric oscillator XO. In the description below, differences from Embodiments 1 and 2 will be mainly described, and identical or corresponding parts will be designated by the same reference numerals and the description thereof may not be repeated.

Figure 10:
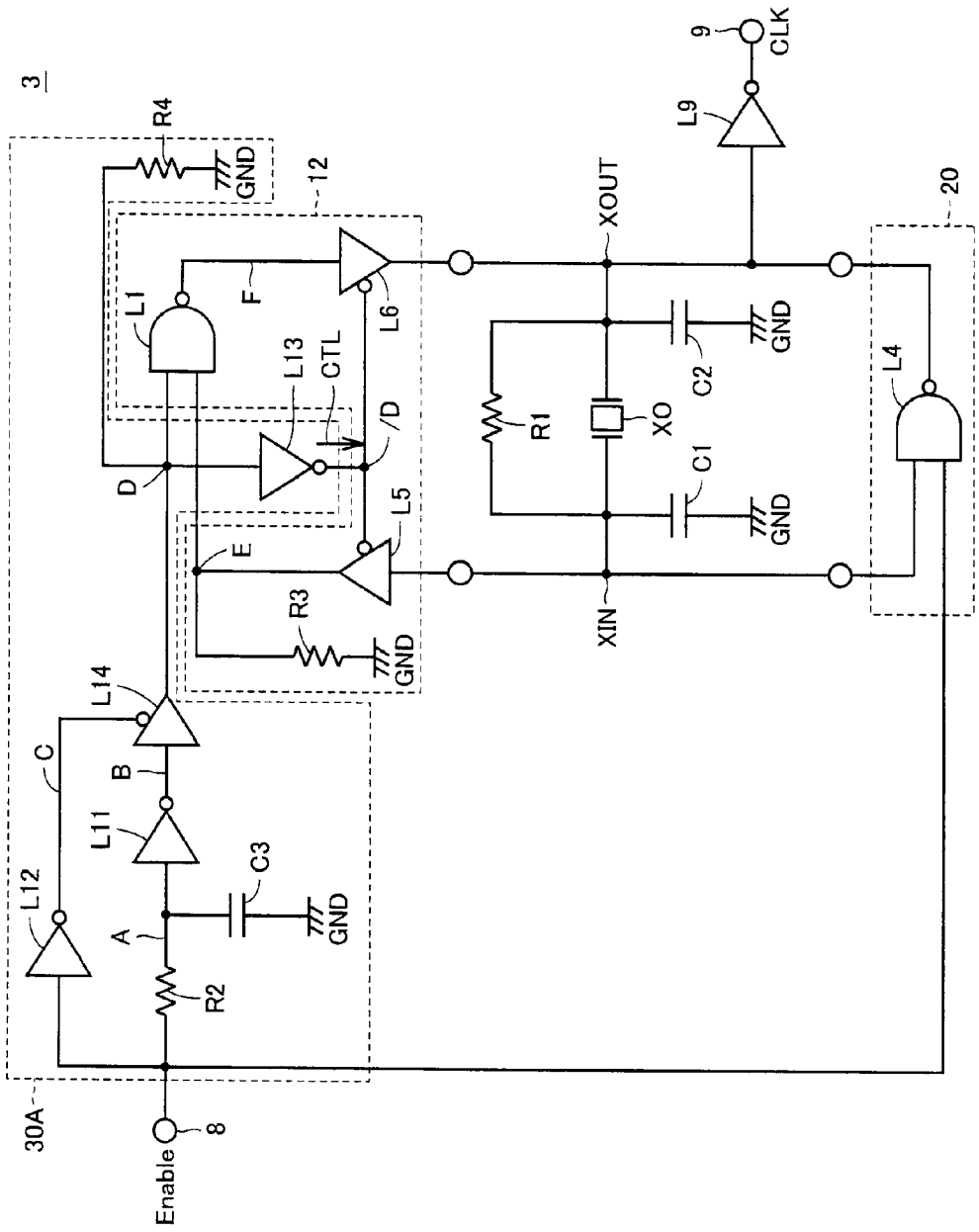
FIG. 10 is a circuit diagram showing a configuration of an oscillation circuit 3 in accordance with Embodiment 3 of the present invention.

FIG. 10 is a circuit diagram showing a configuration of an oscillation circuit 3 in accordance with Embodiment 3 of the present invention. Referring to FIG. 10, oscillation circuit 3 includes piezoelectric oscillator XO, resistive element R1, a first exciting circuit 12, and the second exciting circuit 20 connected between input node XIN and output node XOUT in parallel with one another, capacitor (capacitative element) C1 connected between node XIN and ground node GND, capacitor (capacitative element) C2 connected between node XOUT and ground node GND, a timer circuit 30A, and inverter L9 for shaping a signal from output node XOUT.

The first exciting circuit 12 is a circuit for inverting and amplifying a signal from node XIN and outputting the signal to node XOUT when oscillation is started, and includes three-state buffers L5, L6 and NAND circuit L1. Three-state buffer L5, NAND circuit L1, and three-state buffer L6 are connected in this order in series between nodes XIN and XOUT. The first exciting circuit 12 further includes a resistive element R3 provided between a connection node E connecting three-state buffer L5 with NAND circuit L1 and ground node GND. Resistive element R3 is provided as a pull-down resistor for fixing the voltage at connection node E to the ground voltage when output of the three-state buffer has a high impedance.

One input terminal of NAND circuit L1 is connected to a node D of timer circuit 30A described later. Therefore, NAND circuit L1 operates as an inverter when the voltage at node D is at an H level (in an active state), and its output is fixed to an H level when the voltage at node D is at an L level (in an inactive state).

When a signal input to a gate terminal is at an L level, three-state buffers L5, L6 directly output the input signal, and when a signal input to the gate terminal is at an H level, three-state buffers L5, L6 set their outputs to have a high impedance. A signal obtained by inverting the logic level of a signal at node D is input to the gate terminal. Therefore, three-state buffers L5, L6 operate as buffers when the voltage at node D is at an H level (in an active state), and fix their outputs to a high impedance when the voltage at node D is at an L level (in an inactive state).

The second exciting circuit 20 is a circuit for inverting and amplifying a signal from node XIN and outputting the signal to node XOUT, and includes NAND circuit L4 connected between nodes XIN and XOUT. One input terminal of NAND circuit L4 is connected with enable terminal 8 to which enable signal Enable is input, and the other input terminal of NAND circuit L4 is connected with input node XIN. Therefore, while enable signal Enable is at an L level (in an inactive state), the output of NAND circuit L4 is fixed to an H level, and when enable signal Enable attains an H level (active state), NAND circuit L4 operates as an inverter for exciting piezoelectric oscillator XO.

Timer circuit 30A sets the voltage at node D to an H level (an active state) for a predetermined time from when enable signal Enable attains an H level (active state). Timer circuit 30A includes inverters L11, L12, and L13, a three-state buffer L14, resistive elements R2, R4, and a capacitor (capacitative element) C3. Resistive element R2, inverter L11, and three-state buffer L14 are connected in this order in series between enable terminal 8 to which enable signal Enable is input and node D.

Capacitor C3 is connected between a connection node A connecting resistive element R2 with inverter L11 and ground node GND. Capacitor C3 and resistive element R2 constitute a CR integration circuit.

Inverter L12 is connected between enable terminal 8 and a gate terminal of three-state buffer L14. Therefore, three-state buffer L14 operates as a buffer when enable signal Enable is at an H level (in an active state).

An input terminal of inverter L13 is connected to node D, and an output terminal of inverter L13 (node /D) is connected to gate terminals of three-state buffers L5, L6. Resistive element R4 is fixed between node D and ground node GND, and used as a pull-down resistor for fixing the voltage at node D to an L level when output of three-state buffer L14 has a high impedance.

Next, operation of oscillation circuit 3 will be described.

Figure 11:
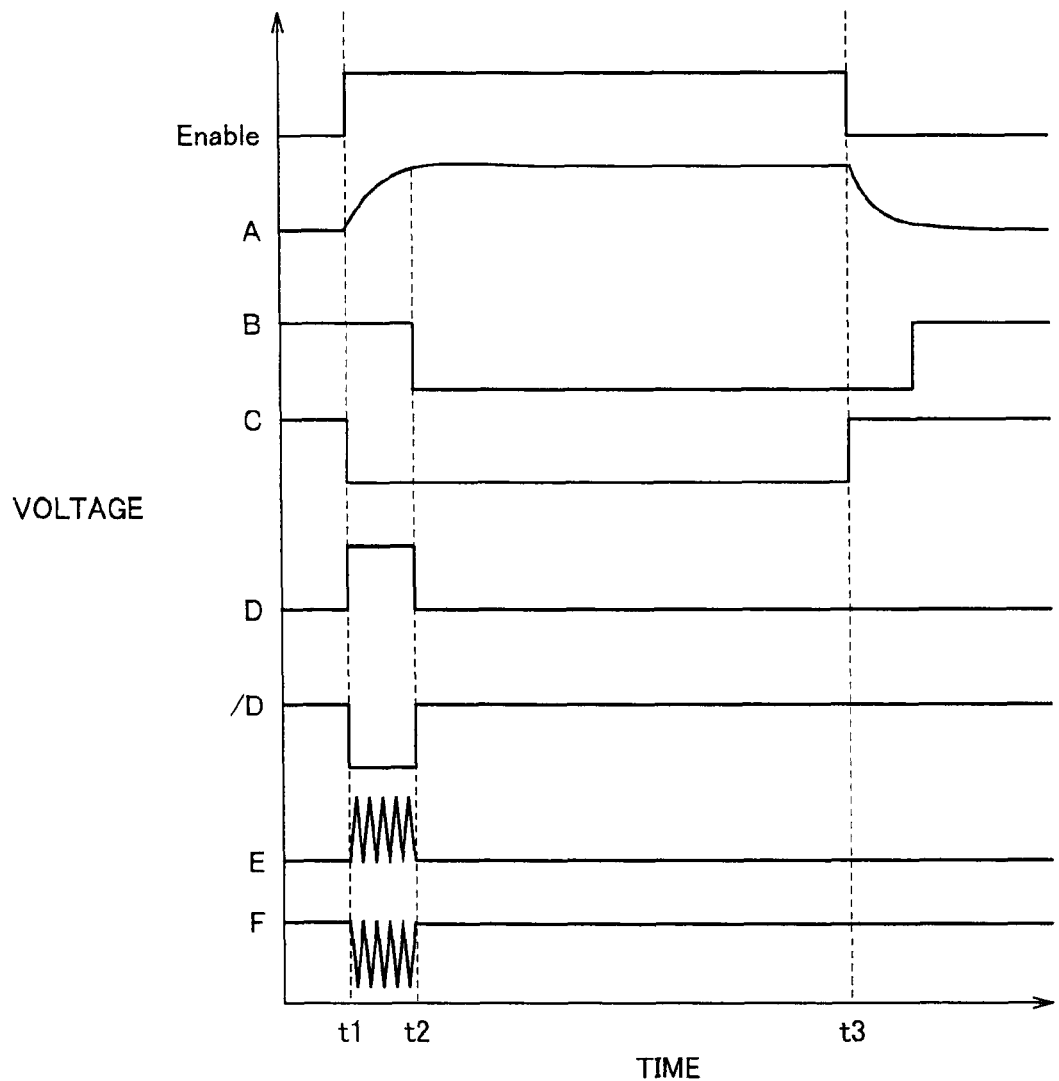
FIG. 11 is a view schematically showing voltage waveforms at various portions of oscillation circuit 3 of FIG. 10.

FIG. 11 is a view schematically showing voltage waveforms at various portions of oscillation circuit 3 of FIG. 10. FIG. 11 shows, in order from the top, a voltage waveform of enable signal Enable, and voltage waveforms at nodes A, B, C, D, /D, E, and F in FIG. 10.

Referring to FIGS. 10 and 11, when enable signal Enable changes from an L level (inactive state) to an H level (active state) at time point t1, the voltage at connection node A between capacitor C3 and resistive element R2 is gradually increased as capacitor C3 is charged. As a result, the voltage at an output terminal of inverter L11 (node B) is at an H level until a time point t2 at which the voltage at node A exceeds a threshold voltage of inverter L11, and attains an L level after time point t2.

The voltage at an output terminal of inverter L12 (node C) is obtained by inverting enable signal Enable. Since the voltage at node C is input to the gate terminal of three-state buffer L14, three-state buffer L14 operates as a buffer circuit from time point t1 to a time point t3 at which enable signal Enable returns to an L level. As a result, the voltage at an output terminal of three-state buffer L14 (node D) changes in the same manner with the voltage at node B from time point t1 to time point t3. Specifically, the voltage at node D is at an H level from time point t1 to time point t2, and is at an L level before time point t1 and after time point t2. Further, the voltage at the output terminal of inverter L13 (node /D) is opposite to the voltage at node D, and is at an L level from time point t1 to time point t2, and is at an H level before time point t1 and after time point t2.

The gate terminals of three-state buffers L5, L6 are connected to node /D. Therefore, three-state buffers L5, L6 operate as buffer circuits from time point t1 to time point t2 in which the voltage at node /D is at an L level (the voltage at node D is at an H level). Before time point t1 and after time point t2, an output terminal of three-state buffer L5 (node E) is fixed to an L level, and thus an output terminal of NAND circuit L1 (node F) is fixed to an H level. Therefore, from time point t1 to time point t2, the voltages at nodes E and F vibrate as piezoelectric oscillator XO oscillates.

As described above, starting from time point t1 at which enable signal Enable attains an H level (active state) to time point t2, piezoelectric oscillator XO is excited by the first exciting circuit 12. After time point t2, excitation of piezoelectric oscillator XO by the first exciting circuit 12 is stopped. The time from time point t1 to time point t2 depends on a time constant of an integration circuit determined by the resistance value of resistive element R2 and the capacitance value of capacitor C3.

On the other hand, NAND circuit L4 constituting the second exciting circuit 20 excites piezoelectric oscillator XO in the time from time point t1 to time point t3 in which enable signal Enable is at an H level (in an active state). Therefore, both the first exciting circuit 12 and the second exciting circuit 20 operate in the time from time point t1 to time point t2 in which oscillation is started, whereas only the second exciting circuit 20 operates in the time from time point t2 to time point t 3 in which oscillation is stabilized. Thereby, power consumption when oscillation is stabilized can be reduced.

Hereinafter, a result of an experiment measuring voltage waveforms at various portions of oscillation circuit 3 of FIG. 10 will be described. In the experiment, a ceramic oscillator was used as piezoelectric oscillator XO in FIG. 10, and the resistance value of resistive element R1 was set to 1 MΩ. Firstly, the result of measuring the enable signal, the voltage at node D, the voltage at node E, and clock signal CLK in FIG. 10 using an oscilloscope will be described.

Figure 12:
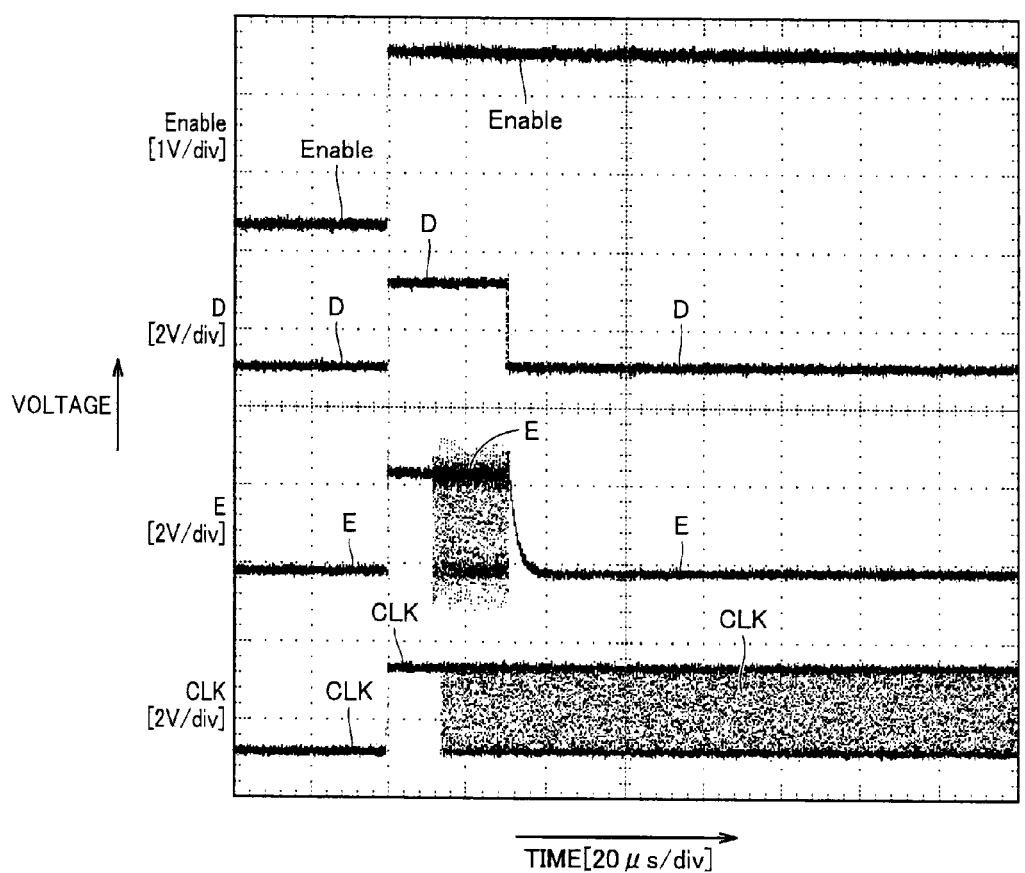
FIG. 12 is a waveform diagram obtained by measuring voltage changes at various portions of oscillation circuit 3 of FIG. 10.

FIG. 12 is a waveform diagram obtained by measuring voltage changes at various portions of oscillation circuit 3 of FIG. 10. In FIG. 12, the axis of ordinate represents voltage, and the axis of abscissas represents time. One scale (division) on the axis of abscissas of a grid on the paper plane represents 20 microseconds. One scale (division) on the axis of ordinate represents 1 V for enable signal Enable, and 2 V for the voltages at nodes D and E and clock signal CLK.

As shown in FIG. 12, when enable signal Enable rises to an H level, the voltage at node D also rises to an H level. Then, the voltage at node D falls when about 30 microseconds have elapsed since enable signal Enable rose. As has been already described, the time in which the voltage at node D is at an H level (30 microseconds) can be adjusted depending on the resistance value of resistive element R2 and the capacitance value of capacitor C3 in FIG. 10.

While the voltage at node D is at an H level (in an active state), the voltage at node E receives the voltage of oscillating piezoelectric oscillator XO and vibrates. Further, clock signal CLK is output while enable signal Enable is at an H level (in an active state).

Next, a result obtained by monitoring clock signal CLK using a time interval analyzer (YOKOGAWA TA320) and measuring the pulse period of clock signal CLK will be described.

Figure 13:
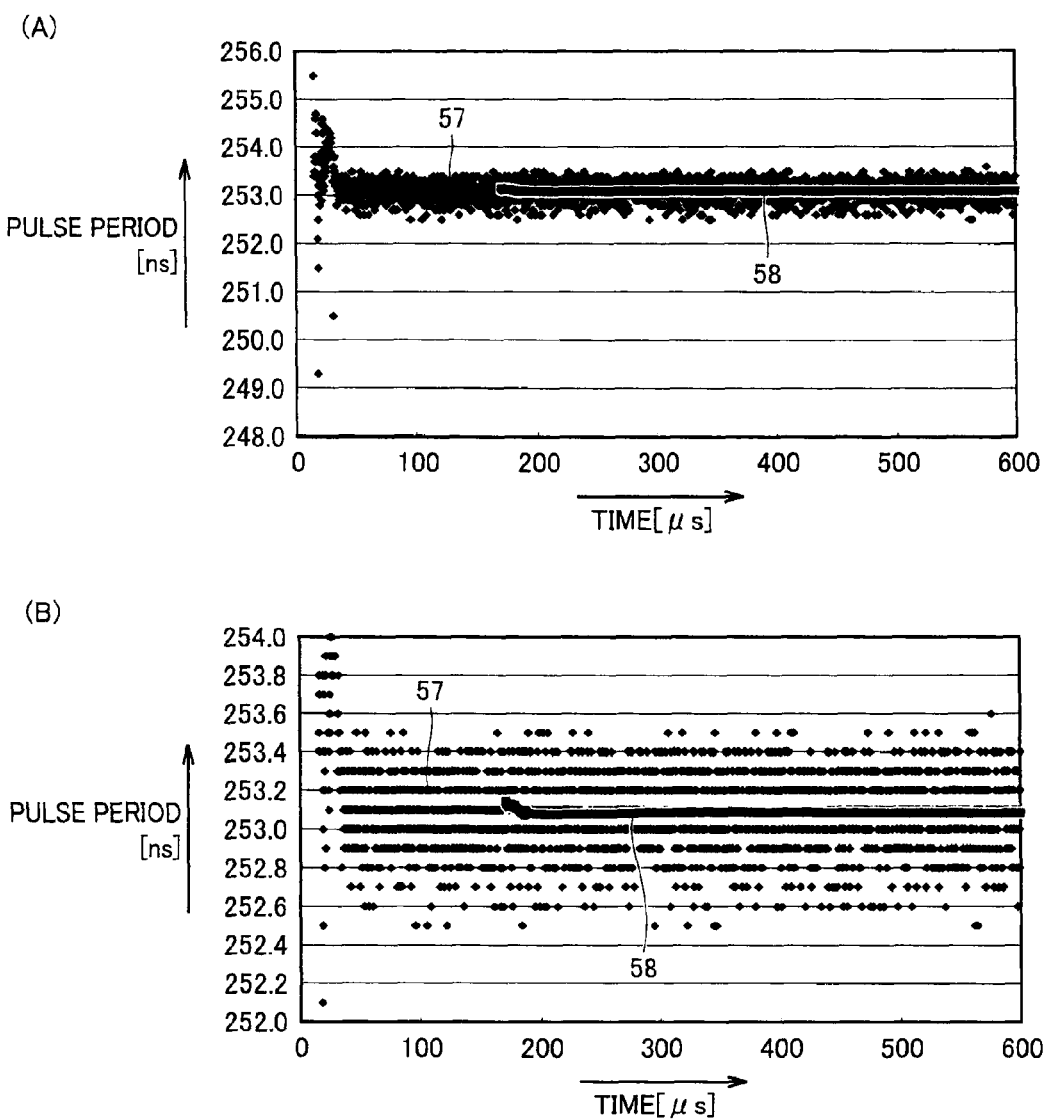
FIG. 13 is a view showing a result of an experiment measuring start-up time of oscillation circuit 3 of FIG. 10.

FIG. 13 is a view showing a result of an experiment measuring the start-up time of oscillation circuit 3 of FIG. 10. FIG. 13(B) is an enlarged view of FIG. 13(A). In FIG. 13(A) and FIG. 13(B), the axis of abscissas represents time elapsed after enable signal Enable attains an H level (active state), and the axis of ordinate represents the pulse period of the clock signal. FIG. 13 shows a measurement value 57 of the pulse period measured at each time point, and a moving average value 58 obtained by performing moving average on measurement values 57 for each section of 155.5 microseconds.

When the start-up time is evaluated as in the cases of FIGS. 6 to 8, the reach time in the case of FIG. 13 is determined as 184.0 microseconds, and thus the start-up time can be evaluated as 28.5 microseconds. This start-up time is shorter than any of those in the cases of FIGS. 6 to 8, because, since each of three-state buffers L5, L6 is equivalent to inverters in four stages when three-state buffers L5, L6 operate as buffer circuits, the number of stages of logic elements on a CMOS inverter basis in oscillation circuit 3 of Embodiment 3 is greater than any of the numbers thereof in the cases of FIGS. 6 to 8.

As described above, according to oscillation circuit 3 of Embodiment 3, switches SW1, SW2 in oscillation circuit 2 of Embodiment 2 can be replaced by using three-state buffers as logic elements in the first and the last stages among the logic elements constituting the first exciting circuit 12. In this case, a voltage signal at node /D to be input to the gate terminals of three-state buffers L5, L6 corresponds to control signal CTL in Embodiment 2. As a result, in the same manner as oscillation circuit 2 of Embodiment 2, when oscillation is started, the start-up time can be reduced by using the first exciting circuit 12 and the second exciting circuit 20 connected in parallel. After oscillation is stabilized, power consumption in entire oscillation circuit 3 can be reduced by using only the second exciting circuit 20 having a power amplification ratio lower than that of the first exciting circuit 12.

[Embodiment 4]

Figure 14:
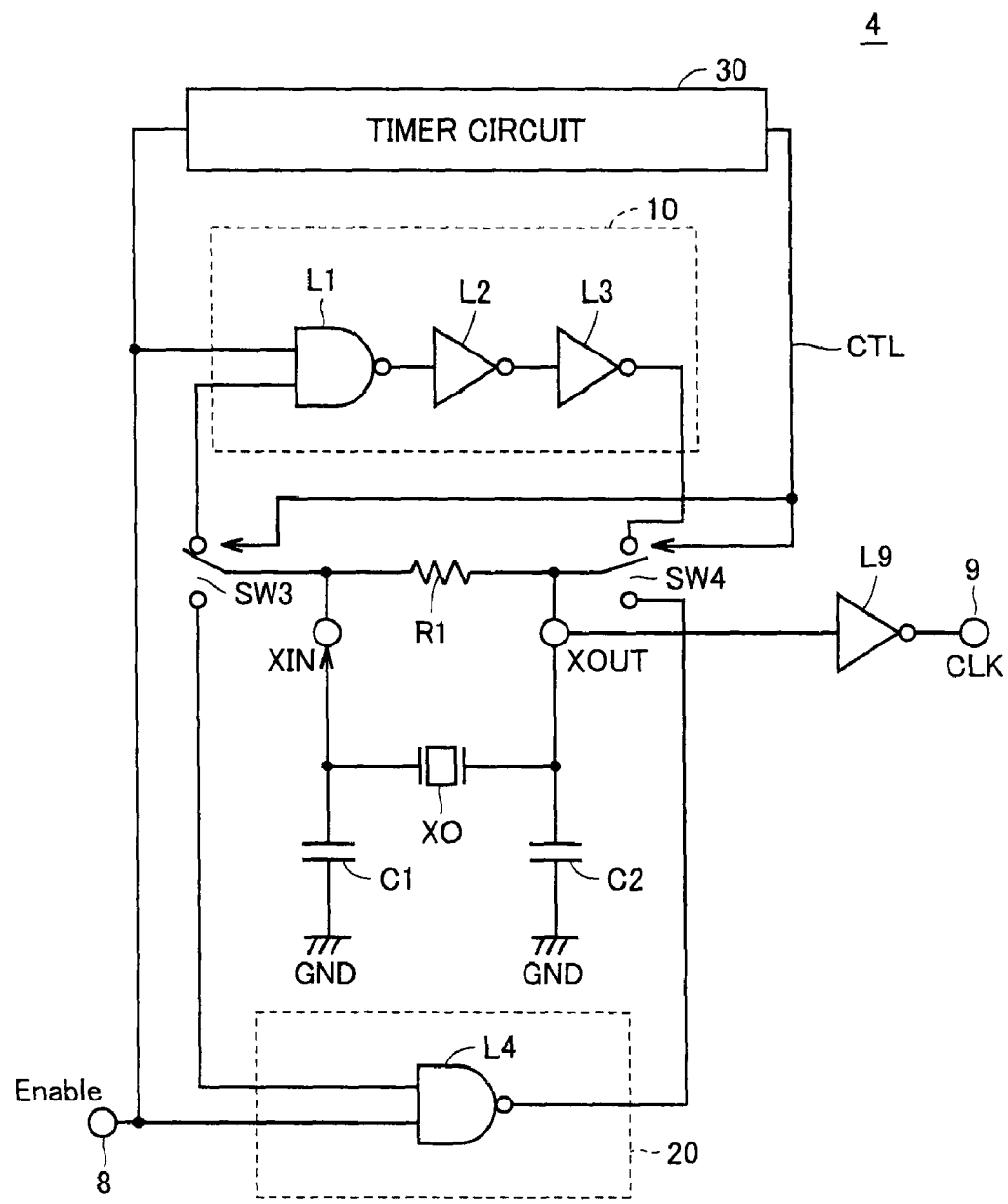
FIG. 14 is a circuit diagram showing a configuration of an oscillation circuit 4 in accordance with Embodiment 4 of the present invention.

FIG. 14 is a circuit diagram showing a configuration of an oscillation circuit 4 in accordance with Embodiment 4 of the present invention. Oscillation circuit 4 of FIG. 14 is different from oscillation circuit 2 of FIG. 9 in that it includes change-over switches SW3, SW4 that switch signal paths instead of on-off switches SW1, SW2 that open/close signal paths. As for the rest, oscillation circuit 4 is identical to oscillation circuit 2 of Embodiment 2. Accordingly, identical or corresponding parts will be designated by the same reference numerals, and the description thereof will not be repeated.

Change-over switch SW3 receives control signal CTL output from timer circuit 30, and connects node XIN with the input end of the first exciting circuit 10 (one input terminal of NAND circuit L1) when control signal CTL is in an active state. Further, change-over switch SW3 connects node XIN with an input end of the second exciting circuit 20 (one input terminal of NAND circuit L4) when control signal CTL is in an inactive state.

Change-over switch SW4 receives control signal CTL output from timer circuit 30, and connects node XOUT with the output end of the first exciting circuit 10 (the output terminal of inverter L3) when control signal CTL is in an active state. Further, change-over switch SW4 connects node XOUT with an output end of the second exciting circuit 20 (an output terminal of NAND circuit L4) when control signal CTL is in an inactive state.

Thereby, when oscillation is started, the start-up time can be reduced by using only the first exciting circuit 10 having a power amplification ratio higher than that of the second exciting circuit 20. After oscillation is stabilized, power consumption in entire oscillation circuit 4 can be reduced by using only the second exciting circuit 20 having a power amplification ratio lower than that of the first exciting circuit 10.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

DESCRIPTION OF THE REFERENCE SIGNS 1 to 4, 101: oscillation circuit, 10, 12: first exciting circuit, 20: second exciting circuit, 30, 30A: timer circuit, C1, C2: capacitor, CLK: clock signal, CTL: control signal, Enable: enable signal, GND: ground node, L1, L4: NAND circuit, L2, L3, L9: inverter, L11, L12, L13: inverter, L5, L6, L14: three-state buffer, R1 to R4: resistive element, SW1, SW2: on-off switch, SW3, SW4: change-over switch, VDD: power supply node, XIN: input node (first node), XO: piezoelectric oscillator, XOUT: output node (second node).

What is claimed is:

1. An oscillation circuit comprising:
a piezoelectric oscillator provided between first and second nodes;
a resistive element provided between said first and second nodes in parallel with said piezoelectric oscillator;
a first capacitive element provided between said first node and a ground node;
a second capacitive element provided between said second node and said ground node;
a first exciting circuit provided between said first and second nodes in parallel with each of said piezoelectric oscillator and said resistive element, for inverting and amplifying a signal from said first node and outputting the signal to said second node;
said first exciting circuit including a plurality of cascade-connected logic elements each used as an amplifier circuit;
a timer circuit outputting a control signal that is in an active state for a predetermined time from when an enable signal attains an active state; and
a second exciting circuit provided between said first and second nodes in parallel with each of said piezoelectric oscillator, said resistive element, and said first exciting circuit, for inverting and amplifying a signal from said first node and outputting the signal to said second node,
wherein said second exciting circuit has a power amplification ratio lower than a power amplification ratio of said first exciting circuit, said second exciting circuit includes a logic element outputting a signal at a constant logic level when said enable signal is in an inactive state, and operating as an amplifier circuit when said enable signal is in an active state, and logic elements in first and last stages among the plurality of logic elements constituting said first exciting circuit are three-state buffers that are in a high impedance state when said control signal is in an inactive state.

2. An oscillation circuit comprising:

a piezoelectric oscillator provided between first and second nodes;

a resistive element provided between said first and second nodes in parallel with said piezoelectric oscillator;

a first capacitive element provided between said first node and a ground node;

a second capacitive element provided between said second node and said ground node;

a first exciting circuit provided between said first and second nodes in parallel with each of said piezoelectric oscillator and said resistive element, for inverting and amplifying a signal from said first node and outputting the signal to said second node;

said first exciting circuit including a plurality of cascade-connected logic elements each used as an amplifier circuit;

a timer circuit outputting a control signal that is in an active state for a predetermined time from when an enable signal attains an active state;

a first switch provided between said first node and an input end of said first exciting circuit to be in an ON state when said control signal is in an active state and to be in an OFF state when said control signal is in an inactive state;

a second switch provided between said second node and an output end of said first exciting circuit to be in an ON state when said control signal is in an active state and to be in an OFF state when said control signal is in an inactive state; and a second exciting circuit provided between said first and second nodes in parallel with each of said piezoelectric oscillator, said resistive element, and said first exciting circuit, for inverting and amplifying a signal from said first node and outputting the signal to said second node, wherein said second exciting circuit has a power amplification ratio lower than a power amplification ratio of said first exciting circuit, and said second exciting circuit includes a logic element outputting a signal at a constant logic level when said enable signal is in an inactive state, and operating as an amplifier circuit when said enable signal is in an active state.

3. An oscillation circuit comprising:

a piezoelectric oscillator provided between first and second nodes;

a resistive element provided between said first and second nodes in parallel with said piezoelectric oscillator;

a first capacitive element provided between said first node and a ground node;

a second capacitive element provided between said second node and said ground node;

a first exciting circuit provided between said first and second nodes in parallel with each of said piezoelectric oscillator and said resistive element, for inverting and amplifying a signal from said first node and outputting the signal to said second node;

said first exciting circuit including a plurality of cascade-connected logic elements each used as an amplifier circuit;

a second exciting circuit provided between said first and second nodes in parallel with each of said piezoelectric oscillator, said resistive element, and said first exciting circuit, for inverting and amplifying a signal from said first node and outputting the signal to said second node, said second exciting circuit having a power amplification ratio lower than a power amplification ratio of said first exciting circuit;

a timer circuit outputting a control signal that is in an active state for a predetermined time from when an enable signal attains an active state;

a first switch connecting an input end of said first exciting circuit with said first node when said control signal is in an active state, and connecting an input end of said second exciting circuit with said first node when said enable signal is in an active state and said control signal is in an inactive state; and a second switch connecting an output end of said first exciting circuit with said second node when said control signal is in an active state, and connecting an output end of said second exciting circuit with said second node when said enable signal is in an active state and said control signal is in an inactive state.

4. The oscillation circuit according to claim 1, wherein at least one of the plurality of logic elements constituting said first exciting circuit outputs a signal at a constant logic level when an enable signal is in an inactive state.

5. The oscillation circuit according to claim 2, wherein at least one of the plurality of logic elements constituting said first exciting circuit outputs a signal at a constant logic level when an enable signal is in an inactive state.

6. The oscillation circuit according to claim 3, wherein at least one of the plurality of logic elements constituting said first exciting circuit outputs a signal at a constant logic level when an enable signal is in an inactive state.

* * * * *